United States Patent [19]
Doty, II et al.

[11] Patent Number: 4,727,339
[45] Date of Patent: Feb. 23, 1988

[54] START-STOP OSCILLATOR HAVING FIXED STARTING PHASE AND MINIMIZED QUIESCENT POWER DISSIPATION

[75] Inventors: James H. Doty, II, Indianapolis, Ind.; Walter G. Gibson, Princeton, N.J.

[73] Assignee: RCA Corporation, Princeton, N.J.

[21] Appl. No.: 924,868

[22] Filed: Oct. 30, 1986

[51] Int. Cl.[4] .............................................. H03B 5/08
[52] U.S. Cl. .............................. 331/173; 331/117 FE
[58] Field of Search ........ 331/116 R, 116 FE, 117 R, 331/117 FE, 167, 169, 172, 173; 358/188

[56] References Cited

U.S. PATENT DOCUMENTS 3,991,388 11/1976 Harshbarger .................. 331/117 R
4,272,736 6/1981 Gercekci et al. .............. 331/108 B Primary Examiner—Eugene R. LaRoche
Assistant Examiner—Robert J. Pascal
Attorney, Agent, or Firm—Paul J. Rasmussen; Peter M. Emanuel; Richard G. Coalter

[57] ABSTRACT

An amplifier having a resonator coupled between input and output terminals thereof supplies a dot clock signal to a character generator in a television receiver. A feedback control circuit supplies DC bias to the resonator during blanking intervals that preceed lines of characters to be displayed to ensure a consistent starting phase for oscillations, removes the DC bias and supplies operating power to the amplifier during a portion of the active video period of each displayed line for sustaining the oscillations and automatically inhibits the supply of amplifier power at the end of each active line of characters to thereby provide three oscillator operating modes of PRIMED, RUNNING and OFF so as to minimize overall power consumption for the oscillator for each field of displayed characters.

9 Claims, 2 Drawing Figures

START-STOP OSCILLATOR HAVING FIXED STARTING PHASE AND MINIMIZED QUIESCENT POWER DISSIPATION

FIELD OF THE INVENTION

This invention relates to oscillator circuitry and particularly to start-stop or pulsed oscillators of the type employing an inductor-capacitor (L-C) resonator or "tank" circuit.

BACKGROUND OF THE INVENTION

Start-stop oscillators are particularly useful in applications where it is desired to provide a burst of oscillations which begin in a predictable phase with respect to a control or keying signal. As an example, such an oscillator may be used to advantage for providing a character dot clock signal to a character generator in a television receiver. By keying the oscillator in synchronism with the scanning of the raster, the character dots produced by the character generator will occur at predictable scan times and the displayed caption formed by the character dots will thus be stable with respect to the displayed picture image. There are, of course, many other uses for start-stop oscillators.

It is known to employ an inductor-capacitor (L-C) resonator as the frequency determining element in a start-stop oscillator. Such "tank" circuits provide excellent frequency stability but are difficult to operate in a pulsed mode because of the energy storage characteristics of the reactive elements. Prior art solutions to this problem have not been entirely satisfactory. As an example, in U.S. Pat. No. 3,991,388 there is described a start-stop oscillator in which oscillations are quickly damped by means of a pair of transistor switches. The circuit includes an inductor connected in parallel with a pair of serially connected capacitors to form the tank circuit of a Colpitts oscillator. The switches, when closed, provide a path to ground for each of the three elements of the tank circuit so that the energy stored in each element is quickly dissipated, thereby rapidly stopping the oscillator. The disadvantage of such an arrangement is that dissipation of the tank circuit energy to stop the oscillator results in a prolonged startup time since the energy must be replaced to initiate oscillation.

It is known that one may initiate oscillations in a resonator circuit quickly and with a predictable starting phase by passing a direct current through the inductor to cause energy to be stored therein and then interrupting the current by means of a switch to thereby release the stored inductor energy which then oscillates between the inductor and capacitors of the resonator circuit. An example of a start-stop Colpitts oscillator employing this principle is described by Gercekci et al. in U.S. Pat. No. 4,272,736. The Gerekci et al. oscillator is proposed for use as the "dot clock" for a character generator and comprises a resonator coupled between input and output terminals of an N-channel field-effect transistor (FET) amplifier. A pair of N-channel transistor switches are coupled between each end of the resonator and respective positive and ground supply terminals. During the period that the oscillator is turned off (e.g. horizontal blanking) a control circuit turns the transistor switches on to apply DC bias to the resonator and concurrently removes gate bias from the amplifier load transistor to disable the amplifier. The oscillator is started by turning the transistor switches off and restoring gate bias to the amplifier load transistor. Since energy is stored in the resonator as a consequence of the DC bias applied while the oscillator was off, the oscillator starts immediately and with a fixed starting phase.

SUMMARY OF THE INVENTION

It is recognized herein that the aforementioned method of applying DC bias to the resonator of a start-stop oscillator to obtain the advantage of a fixed starting phase also has a disadvantage in terms of power dissipation since power is continuously dissipated in the resonator and the transistors which supply the DC bias when the oscillator is off. This power dissipation problem is particularly troublesome in applications, such as character generation, where the average duty cycle of the oscillator may be very low at times. As an example, generating a single line of characters using a 5×7 font requires seven lines of character dots. Since the active portion of an NTSC standard line interval is about 53 microseconds, displaying a single line of characters thus requires only about 371 microseconds of oscillator ON time during each field (16.7 milliseconds). This means that the oscillator would be OFF for over 97 percent of each field but during this period power will be dissipated in the resonator bias circuitry of the conventional start-stop oscillator resulting in a very poor overall efficiency. This problem is particularly troublesome when the oscillator is constructed as an integrated circuit where heat build-up due to the poor efficiency may limit the number of circuits that may be integrated or require external cooling.

The present invention resides in part in recognizing the existence of the aforementioned problem of resonator power dissipation in start-stop oscillators and in part in meeting the need for reduced power dissipation and improved efficiency in low duty cycle applications of the general type described.

A start-stop oscillator embodying the invention includes an amplifier means having power input means for receiving operating current supplied thereto and having signal input and signal output terminals with a resonator coupled therebetween for causing oscillations to occur in response to the operating current. A first switch means is responsive when closed for supplying a direct current bias to the resonator means and a second switch means is responsive when closed for supplying the operating current to the power input means of the amplifier means. A switch control means, responsive to an enabling signal and to a periodic timing signal supplied thereto, closes the first switch means and opens the second switch means during a first time interval, opens said first switch means and closes said second switch means during a second time interval and opens each of said switch means during a third time interval.

In accordance with a further aspect of the invention the oscillator includes a feedback path coupled from the amplifier means to the control means for initiating the third time interval in response to a predetermined number of cycles of the oscillations produced by the amplifier means.

BRIEF DESCRIPTION OF THE DRAWING

The foregoing and further features of the invention are illustrated in the accompanying drawing in which.

DETAILED DESCRIPTION

Figure 1:
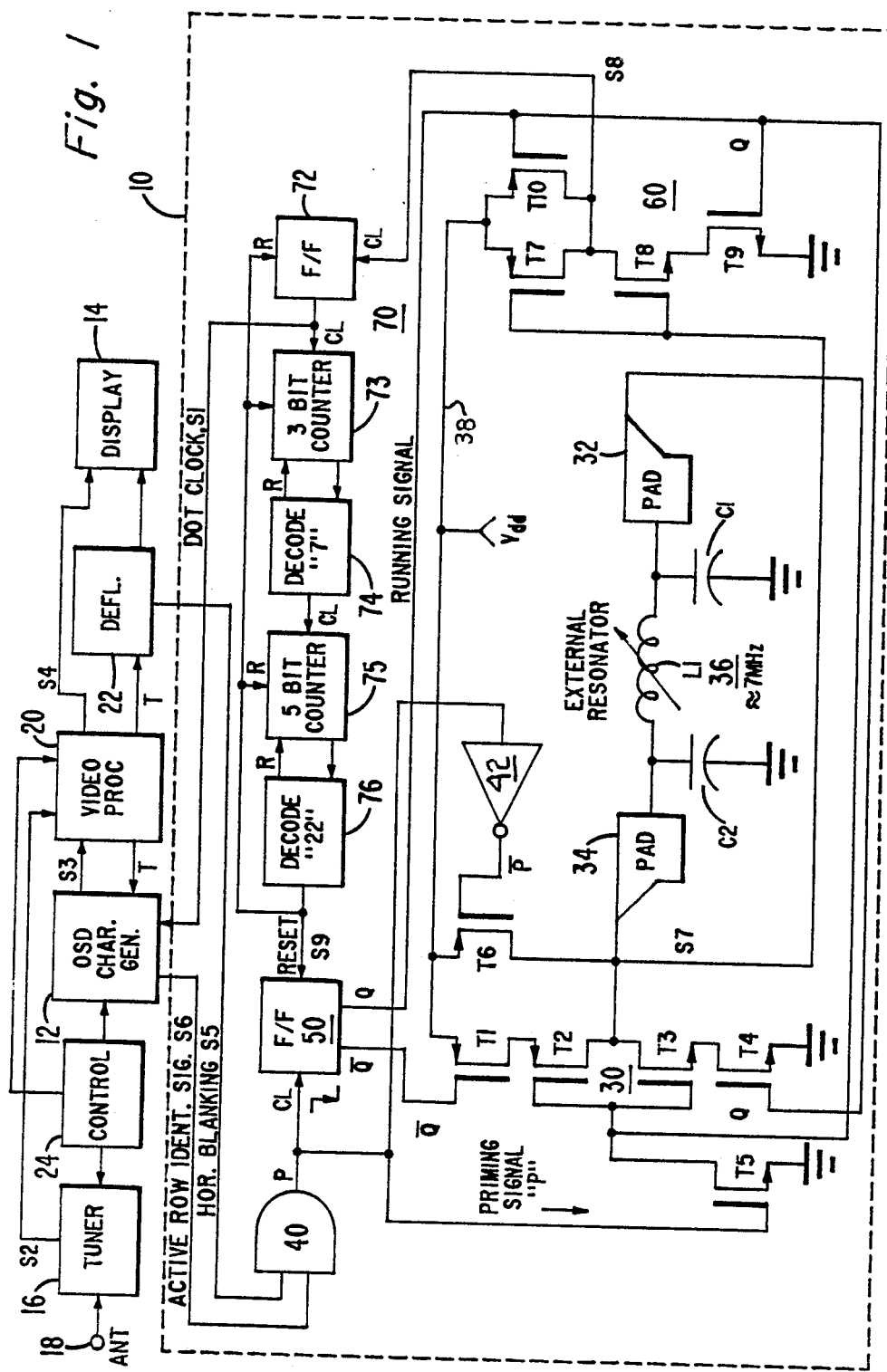
FIG. 1 is a block diagram, partially in schematic form, of a television receiver having a start-stop oscillator embodying the invention for providing a character dot signal to a character generator in the receiver.

The television receiver of FIG. 1 includes a start-stop oscillator 10 (outlined in phantom) for supplying a character dot clock signal S1 to an on-screen display (OSD) character generator 12. In this application the ON-OFF duty cycle of oscillator 10 can be expected to vary over a wide range of values depending on the number of lines of characters to be displayed on the receiver display 14 and so, as previously explained, there is a particular need for the improved efficiency and low power dissipation features of the invention. As an overview, these advantages result, in part, because the starting or "priming" power for the oscillator is applied only during the horizontal blanking interval immediately preceeding a line of character dots to be displayed and not during blanking intervals preceeding blank character lines or during vertical blanking. As will be explained, this operation is facilitated by control circuitry which provides the oscillator with three distinct operating modes, ON-OFF-PRIMED, and feedback is used to force the oscillator into its OFF mode at the end of every line of character dots regardless of whether the oscillator will be ON or OFF during a following line. This feature additionally prevents the possibility of the oscillator being placed concurrently in the PRIMED and ON operating modes without the need for complicated power arbitration logic circuitry and improves the reliability and repeatability of generation of uniform character dots in the overall system.

The receiver includes a tuner unit 16 having an antenna input 18 for receiving RF modulated television signals and an output coupled to supply a baseband video output signal S2 to a video processing unit 20 which is also coupled to receive a character signal S3 produced by OSD character generator 12. Video processor 20 includes circuitry for detecting synchronizing components of video signal S2 and generates timing signals (T) for synchronizing character generator 12 and deflection processor 22. Other functions provided by processor 20 include inserting the character signal S3 into the video signal S2 to generate a display video signal S4 for display 14, hue and saturation control, peaking and so forth. Control of tuner 16, video processor 20 and OSD character generator 12 is provided by a control unit 24 which, illustratively, may comprise a microprocessor responsive to user inputs for generating channel selection, character selection and various video processing control signals. When displaying captions, OSD generator 12 receives the dot clock signal S1 from oscillator 10 and converts the message information provided by control unit 24 into characters in dot matrix form for display on unit 14 (e.g., a kinescope).

Start-stop oscillator 10, embodying the invention, includes a complementary field-effect transistor amplifier 30 comprising transistors T2 and T3 having gate electrodes connected to an input terminal (PAD 32) and drain electrodes connected to an output terminal (PAD 34). The input and output terminals are referred to as PADs because in a preferred application of the invention, all elements of oscillator 10 are constructed in an integrated circuit except three external components comprising a resonator 36. The term "PAD" is short for "bonding pad" to which the external resonator 36 is connected. Resonator 36 comprises an inductor L1 connected between input and output terminals (PADs) 32 and 34 and a pair of shunt capacitors C1 and C2 which couple terminals 32 and 34, respectively, to ground thereby forming the "tank" circuit of a Colpits type of oscillator. Oscillations are produced when operating power is supplied to the source electrodes of the amplifier transistors T2 and T3. The component values for L1, C1 and C2 are selected such that the nominal frequency of oscillation is about 7 MHz in this example of the invention. Exemplary values are 26 micro-Henries for L1 and 30 pico-farads for each of C1 and C2. A higher or lower frequency may be used for displaying more or fewer characters per line.

Operating current for the power input terminals of amplifier 30 (e.g., the source electrodes of T2 and T3) is provided by a complementary field-effect transistor switch comprising transistors T1 and T4. The conduction path of P-type switching transistor T1 is connected between a positive supply bus 38 (to which supply voltage Vdd is applied) and the source of P-type amplifier transistor T2. The conduction path of N-type switching transistor T4 is connected between the source of N-type amplifier transistor T3 and ground. When switching transistors T1 and T4 are both biased ON (as will be explained) operating current is supplied to amplifier 30 (transistors T2 and T3) and oscillations are produced. The amplifier is disabled when transistors T1 and T4 are OFF. In this condition no quiescent power is dissipated in amplifier 30.

A second switch comprising a pair of complementary transistors T5 and T6 is included in oscillator 10 for supplying direct current bias to resonator 36. The function of this bias is to condition or "prime" the oscillator to start with a fixed predictable phase as will be explained. Also, as will be explained, provisions are made to ensure that the priming switches T5 and T6 are never closed when the power switches T1 and T4 are closed which otherwise could disable the oscillator and cause a substantial power drain on the Vdd supply bus 38.

Direct current bias is supplied from bus 38 to PAD 34 by means of the conduction path of P-channel field effect transistor T6 and is withdrawn from PAD 32 to ground by means of the conduction path of N-channel field effect transistor T5. When both transistors are ON, the DC bias flows from PAD 34 to PAD 32 via inductor L1 of resonator 36. For this condition, and neglecting the resistance of inductor L1, capacitors C1 and C2 will be charged to a steady state voltage equal to Vdd times the ON resistance of transistor T5 divided by the sum of the ON resistances of transistors T5 and T6. When transistors T5 and T6 are turned OFF, the DC bias current flowing through inductor L1 will tend to continue to flow thereby discharging capacitor C2 and charging capacitor C1. Accordingly, the first cycle of oscillations at the amplifier output is negative going at PAD 34 and is positive-going at the amplifier input (PAD 32).

Figure 2:
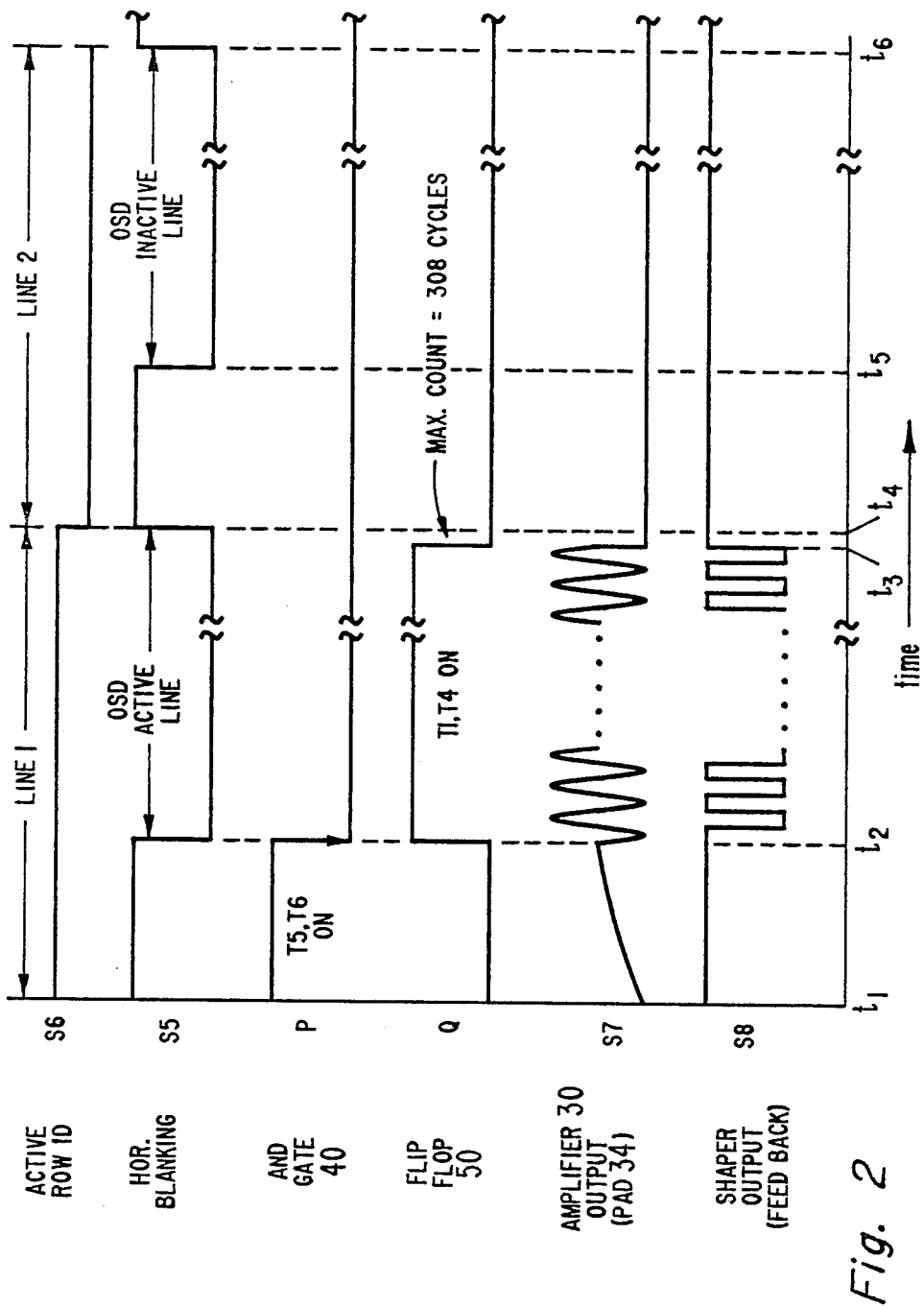
FIG. 2 is a timing diagram illustrating operation of the receiver of FIG. 1.

The remaining elements of start-stop oscillator 10 provide the function of controlling the amplifier power switch (T1,T4) and the resonator bias switch (T5,T6) in a timed relationship with generation of characters to be displayed so as to provide three distinct operating modes, namely, PRIMED, ON and OFF. Specifically, a priming signal P is produced by means of an AND gate 40 having inputs connected to receive a horizontal blanking signal S5 provided by deflection processing unit 22 and an active row identification signal S6 provided by character generator 12. Signal S6 is HIGH for each horizontal line interval of character dots and LOW otherwise. Accordingly, as shown in FIG. 2, the output of AND gate 40 is HIGH only during the horizontal blanking interval (t1–t2) preceeding a line of characters to be displayed (e.g., line 1) and is LOW at all other times. The priming signal P is applied directly to the gate electrode of transistor T5 and via inverter 42 to the gate electrode of transistor T6. Accordingly, transistors T5 and T6 are ON during the blanking interval (t1–t2) of line 1 thereby priming resonator 36 as previously explained.

The output of AND gate 40 is also connected to the clock input CL of a negative edge triggered flip-flop 50 having true (Q) and complemented (Q-bar) outputs connected to the gates of transistors T4 and T1, respectively. Accordingly, at the end of the priming interval t1–t2, flip-flop 50 is SET by the falling edge of priming signal P thereby turning ON the power switching transistors T1 and T4 at the time that the priming signal P turns the biasing transistors (T5 and T6) off. Amplifier 30 is thus turned ON and the rising voltage at its input from PAD 32 (signal S7 in FIG. 2) and the falling voltage at its output from PAD 34 (caused by turn-off of the bias transistor) initiates oscillations as previously explained which are sustained throughout most of the active portion of line 1 by amplifier 30.

Oscillations produced by amplifier 30 are terminated just prior to the end of line 1 (t3 in FIG. 2) by means of a feedback path from PAD 34 to flip-flop 50. Two reasons for this aspect of the invention are (1) to avoid the possibility of amplifier 30 being ON when priming current is applied to resonator 36 which otherwise could cause excessive current flow and misstiming and (2) to ensure that the oscillator automatically assumes a "powered down" condition at the end of each row of character dots. By this latter feature, the oscillator ON time is rendered independent of the on period of the active row identification signal and so external ON cycle timing is not required. The feedback path which provides these features includes a pulse shaping circuit 60 and a counter chain 70 connected in cascade between the output (34) of amplifier 30 and the RESET input of flip-flop 50.

Pulse-shaping circuit 60 comprises P-channel transistors T7 and T10 and N-channel transistors T8 and T9 connected to form a complementary field-effect transistor NAND gate. The gates of transistors T7 and T8 are connected to receive the oscillator output signal S7 and the gates of transistors T9 and T10 are connected to receive the true (Q) output signal of flip-flop 50. As shown in FIG. 2 the oscillator output signal rises to about half the supply voltage during the priming interval t1–t2. This "half-voltage" condition could lead to an indeterminate logic state in CMOS circuits because logic threshold voltages in such circuits can vary over a relatively wide range. This problem is avoided by shaping circuit 60 which forces the output signal S8 to be at a definite logic state (HIGH in this case) whenever flip-flop 50 is RESET (i.e., during the horizontal blanking interval as shown in FIG. 2).

Counter 70 counts cycles of the pulse-shaped oscillator output signal S8 to generate the dot clock signal S1 for OSD character generator 12 and the feedback signal S9 for resetting flip-flop 50 which stops the oscillator after 308 cycles have occurred. Counter 70 comprises a flip-flop 72 which divides the 7 MHz shaped amplifier output signal by two to generate the dot clock signal S1. The output of flip-flop 72 is divided by 7 by means of a 3-bit counter 73 and decoder 74 and this output is further divided by 22 to produce the reset signal S9 by means of a 5-bit counter 75 and decoder 76. Flip-flop 50 is thus reset after 154 cycles of the dot clock signal S1 have occurred in a line which corresponds to 308 cycles of the amplifier output signal S7. The number 154 is determined by multiplying the number of characters per line times the number of horizontal dots per character plus spacing (i.e., 22×7). For this example, it is assumed that the characters are 5 dots wide and spaced apart by 2 dots. The function provided by flip-flop 72 is to ensure that the dot clock signal S1 has symmetrical ON and OFF times. To ensure a consistent starting phase of signal S1, flip-flop 72 is reset by the output of decoder 76. Counters 73 and 75 are also reset by signal S9 to provide a consistent starting count.

What is claimed is:

1. A start-stop oscillator, comprising:
   amplifier means having power input means for receiving operating current supplied thereto and having input and output terminals with a resonator coupled therebetween for causing oscillations to occur in response to said operating current;
   first switch means responsive when closed for supplying a direct current bias to said resonator means;
   second switch means responsive when enabled for supplying said operating current to said power input means of said amplifier means; and
   switch control means responsive to an enabling signal and to a periodic timing signal supplied thereto for closing said first switch means and opening said second switch means during a first time interval, for opening said first switch means and closing said second switch means during a second time interval and for opening each of said first and second switch means during a third time interval.

2. A start-stop oscillator as recited in claim 1 further comprising a feedback path coupled from a selected one of said input and output terminals of said amplifier means and said switch control means for initiating said third time interval in response to a predetermined number of cycles of said oscillations occurring during said second time interval.

3. A start-stop oscillator as recited in claim 2 wherein said feedback path includes gate means for enabling feedback soley during said second time interval.

4. A start-stop oscillator as recited in claim 1 further comprising:
   a character generator for providing a character output signal and a line identification signal signifying each active line of said character output signal;
   a source for providing a horizontal timing signal; and
   logic gate means in said switch control means for logically combining said line identification signal and said horizontal timing signal for determining the period said first switch means is closed and for initiating closure of said second switch means; and
   counter means in said control means for counting said oscillations and for opening said second switch means when a given number of said oscillations have occurred.

5. A start-stop oscillator, comprising:
   amplifier means having power input means for receiving operating current supplied thereto and having input and output terminals with a resonator coupled therebetween for causing oscillations to occur in response to said operating circuit;

a source responsive to a horizontal timing signal and to a line identification signal supplied thereto for providing a priming signal; and control means responsive to said priming signal for applying a direct current bias to said resonator means, responsive to termination of said priming signal for applying said operating current to said amplifier means, and responsive to a given number of said oscillations for removing said operating current from said amplifier means for causing said oscillations to cease.

6. A start-stop oscillator as recited in claim 5 wherein said control means includes:

bistable means responsive to termination of said priming signal for assuming a SET condition and having output means coupled to switch means for applying said operating current to said amplifier means when in said SET condition; and counter means responsive to said given number of said oscillations for supplying a RESET signal to said bistable means for inhibiting the supply of said operating current to said amplifier means.

7. A start-stop oscillator as recited in claim 6 wherein said control means further comprises gate means responsive to said SET condition of said bistable means for supplying said oscillations to said counter means and responsive to said RESET condition for inhibiting said supply of said oscillations.

8. A start-stop oscillator, comprising:

first, second, third and fourth field-effect transistors connected in series between a source of supply voltage and a ground point;

first and second bonding pads connected to respective gate and drain electrodes of said second and third transistors and having a resonator coupled therebetween;

a fifth transistor connected between said ground point and said first bonding pad and a sixth transistor connected between said source of supply voltage and said second bonding pad;

logic gate means coupled to supply turn-on bias to said fifth and sixth transistors during a given time interval;

counter means; and bistable means having a clock input connected to an output of said logic gate means for setting said bistable means upon termination of said given time interval, having output means coupled to apply turn-on bias to said first and fourth transistors when said bistable means is set for causing oscillations to be produced at said bonding pads and having a reset input coupled via said counter means to a selected one of said bonding pads for resetting said bistable means in response to a given number of said oscillations produced at said selected bonding pad.

9. A start-stop oscillator as recited in claim 8 further comprising second logic gate means responsive to said turn-on bias produced by said bistable means for gating said oscillations produced at said selected bonding pad for application to said counter means.

* * * * *